United States Patent

Hori et al.

[11] Patent Number: 5,846,329
[45] Date of Patent: Dec. 8, 1998

[54] PLASMA PROCESSING APPARATUS

[75] Inventors: Hisashi Hori; Kazuto Ohbuchi; Atsushi Matsushita; Kaoru Sakamoto, all of Kanagawa, Japan

[73] Assignee: Tokyo Ohka Kogyo Co., Ltd., Kanagawa, Japan

[21] Appl. No.: 805,062

[22] Filed: Feb. 24, 1997

[30] Foreign Application Priority Data

Feb. 23, 1996 [JP] Japan .................................. 8-035863
Nov. 13, 1996 [JP] Japan .................................. 8-301399

[51] Int. Cl.⁶ .................................................. C23C 16/00
[52] U.S. Cl. ................................ 118/723 E; 118/723 ER; 118/723 R; 156/345
[58] Field of Search ........................... 118/723 R, 723 E, 118/723 ER, 723 I, 723 IR; 315/111.21, 111.31, 111.51; 156/345; 204/298.06, 298.14, 298.34

[56] References Cited

U.S. PATENT DOCUMENTS 5,146,137 9/1992 Gesche et al. .
5,385,624 1/1995 Amemiya et al. ...................... 156/345
5,435,880 7/1995 Minato et al. .
5,494,522 2/1996 Moriya et al. .
5,587,207 12/1996 Govokhovsky .......................... 427/571
5,591,268 1/1997 Usue et al. ............................ 118/723 E
5,681,418 10/1997 Ishimani .................................. 156/345

FOREIGN PATENT DOCUMENTS

6132250 5/1994 Japan .
08130185A 5/1996 Japan .

*Primary Examiner*—R. Bruce Breneman
*Assistant Examiner*—Luz Alejandro
*Attorney, Agent, or Firm*—Carrier, Blackman & Associates, P.C.; Joseph P. Carrier

[57] ABSTRACT

A plasma processing apparatus has first and second electrodes disposed around a tubular chamber for generating a plasma. Each of the first and second electrodes comprises a plurality of web-shaped electrode segments spaced by a constant distant and disposed substantially halfway around the chamber. Each of the web-shaped electrode segments has opposite ends fastened to a pair of respective insulators disposed diametrically opposite to each other across the chamber. The web-shaped electrode segments of the first electrode are electrically connected to each other by a conductor on one of the insulators, and the web-shaped electrode segments of the second electrode are electrically connected to each other by a conductor on the other conductors. The first electrode is connected to a high-frequency power supply, and the second electrode is connected to ground.

21 Claims, 10 Drawing Sheets

PLASMA PROCESSING APPARATUS

BACKGROUND OF THE INVENTION

1. Field of the Invention

The present invention relates to a plasma processing apparatus for etching or otherwise processing a film deposited on a surface of a workpiece such as a semiconductor wafer.

2. Description of the Related Art

One known plasma processing apparatus for etching or otherwise processing a film deposited on a surface of a semiconductor wafer comprises a first electrode vertically disposed partly around a chamber of quartz or the like and connected to a high-frequency power supply and a second electrode vertically disposed partly around the chamber for generating a plasma between itself and the first electrode.

The plasma is generated mainly in regions where the first and second electrodes are positioned most closely to each other. Each of the first and second electrodes is of a semicylindrical shape. Therefore, the plasma is generated in two vertical linear regions extending along the chamber between confronting edges of the first and second electrodes.

The two vertical linear regions where the plasma is generated do not allow a uniform plasma to be produced within the chamber. Solutions to such a problem are disclosed in Japanese laid-open patent publications Nos. 6-132250 and 8-130185.

Japanese laid-open patent publication No. 6-132250 reveals a plasma processing apparatus which has first and second comb-toothed electrodes which have teeth and recesses held in interdigitating relationship to each other. Japanese laid-open patent publication No. 8-130185 shows a plasma processing apparatus which has first and second web-shaped electrodes that are spaced from each other and helically wound around chamber.

The electrode structure shown in either of Japanese laid-open patent publication No. 6-132250 or 8-130185 is effective to generate a plasma substantially fully around the chamber.

However, either of Japanese laid-open patent publication No. 6-132250 or 8-130185 does not disclose any means for stably fixing the electrodes, which are extremely thin, to the outer circumferential surface of the chamber at given locations thereon. According to Japanese laid-open patent publication No. 6-132250, it is difficult to accurately position and secure the teeth of one of the electrodes in the recesses of the other electrode. In the disclosure of Japanese laid-open patent publication No. 8-130185, the web-shaped electrodes helically wound around the chamber cannot easily be spaced at a constant distance from each other. Consequently, the plasma processing apparatus disclosed in either of Japanese laid-open patent publication No. 6-132250 or 8-130185 tends to generate a nonuniform plasma.

SUMMARY OF THE INVENTION

It is therefore an object of the present invention to provide a plasma processing apparatus having first and second electrodes disposed around a chamber, either as a pair of comb-toothed electrodes having teeth and recesses held in interdigitating relationship to each other, or a pair of web-shaped electrodes helically wound around the chamber, the first and second electrodes of the pair being accurately positioned and kept out of positional displacement after they have been installed on the chamber.

To achieve the above object, there is provided in accordance with a first aspect of the present invention a plasma processing apparatus comprising a chamber having a substantially tubular shape with a closed upper end thereof, a first electrode disposed on the chamber and connected to a high-frequency power supply, a second electrode disposed on the chamber for generating a plasma between the second electrode and the first electrode, the second electrode being connected to ground or a power supply which supplies electric energy of a lower frequency than electric energy supplied by the high-frequency power supply, a pair of insulators disposed outside of the chamber, and a pair of conductors mounted respectively on the insulators, each of the first electrode and the second electrode comprising a plurality of web-shaped electrode segments, the web-shaped electrode segments of the first electrode and the web-shaped electrode segments of the second electrode being vertically alternately arranged in spaced relationship, each of the web-shaped electrode segments being disposed substantially halfway around the chamber and having opposite ends fastened to the insulators, respectively, the web-shaped electrode segments of the first electrode being electrically connected to each other by one of the conductors, and the web-shaped electrode segments of the second electrode being electrically connected to each other by the other of the conductors.

According to a second aspect of the present invention, there is provided a plasma processing apparatus comprising a chamber having a substantially tubular shape with a closed upper end thereof, a first electrode disposed on the chamber and connected to a high-frequency power supply, a second electrode disposed on the chamber for generating a plasma between the second electrode and the first electrode, the second electrode being connected to ground or a power supply which supplies electric energy of a lower frequency than electric energy supplied by the high-frequency power supply, a single insulator positioned outside of the chamber, and a pair of conductors mounted on the single insulator, each of the first electrode and the second electrode comprising a plurality of web-shaped electrode segments, the web-shaped electrode segments of the first electrode and the web-shaped electrode segments of the second electrode being vertically alternately arranged in spaced relationship, each of the web-shaped electrode segments being disposed substantially fully around the chamber and having opposite ends fastened to the single insulator, the web-shaped electrode segments of the first electrode being electrically connected to each other by one of the conductors, and the web-shaped electrode segments of the second electrode being electrically connected to each other by the other of the conductors.

According to a third aspect of the present invention, there is provided a plasma processing apparatus comprising a chamber having a substantially tubular shape with a closed upper end thereof, a pair of first and second electrodes helically wound around the chamber and spaced from each other by a constant gap, a pair of insulators disposed outside of the chamber, and a plurality of conductors mounted on the insulators, each of the first electrode and the second electrode comprising a plurality of web-shaped electrode segments each disposed substantially halfway around the chamber and having opposite ends fastened to the insulators, the web-shaped electrode segments of the first electrode being electrically connected to each other by a first group of the conductors, and the web-shaped electrode segments of the second electrode being electrically connected to each other by a second group of the conductors.

According to a fourth aspect of the present invention, there is provided a plasma processing apparatus comprising a chamber having a substantially tubular shape with a closed upper end thereof, a pair of first and second electrodes helically wound around the chamber and spaced from each other by a constant gap, a single insulator disposed outside of the chamber, and a plurality of conductors mounted on the single insulator, each of the first electrode and the second electrode comprising a plurality of web-shaped electrode segments each disposed substantially fully around the chamber and having opposite ends fastened to the single insulator, the web-shaped electrode segments of the first electrode being electrically connected to each other by a first group of the conductors, and the web-shaped electrode segments of the second electrode being electrically connected to each other by a second group of the conductors.

In each of the third and fourth aspects of the present invention, the first electrode may be connected to a high-frequency power supply, and the second electrode may be connected to a power supply which supplies electric energy of a lower frequency than electric energy supplied by the high-frequency power supply. Alternatively, each of the first electrode and the second electrode may have an end (upper end) connected to a high-frequency power supply, and an opposite end (lower end) connected to ground or a power supply which supplies electric energy of a lower frequency than electric energy supplied by the high-frequency power supply.

According to a fifth aspect of the present invention, there is provided a plasma processing apparatus comprising a chamber having a substantially tubular shape with a closed upper end thereof, an electrode helically wound around the chamber and comprising a plurality of web-shaped electrode segments spaced by a constant gap and disposed substantially halfway around the chamber, a pair of insulators disposed outside of the chamber, and a plurality of conductors mounted on the insulators, each of the web-shaped electrode segments having opposite ends fastened to the insulators, the web-shaped electrode segments being electrically connected to form the electrode by the conductors.

In the fifth aspect of the present invention, the electrode may have an end connected to a high-frequency power supply, and an opposite end connected to ground or a power supply which supplies electric energy of a lower frequency than electric energy supplied by the high-frequency power supply.

An uppermost one of the web-shaped electrode segments may serve as the first electrode in the first through fourth aspects of the invention, and the plasma processing apparatus may further comprise a lowermost third electrode disposed on the chamber below the first and second electrodes and connected to ground, for thereby enabling the first and second electrodes to generate a more stable plasma.

The plasma processing apparatus may further comprise a base having an opening defined therein, the chamber having an open lower end mounted on the base in covering relationship to the opening, and a table for supporting a workpiece to be processed, the table being vertically movably disposed in the opening.

The chamber may be in the shape of a bell jar with its upper end closed, and a reaction gas inlet tube may be connected to the upper end or an upper portion, slightly lower than the upper end, of the chamber.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
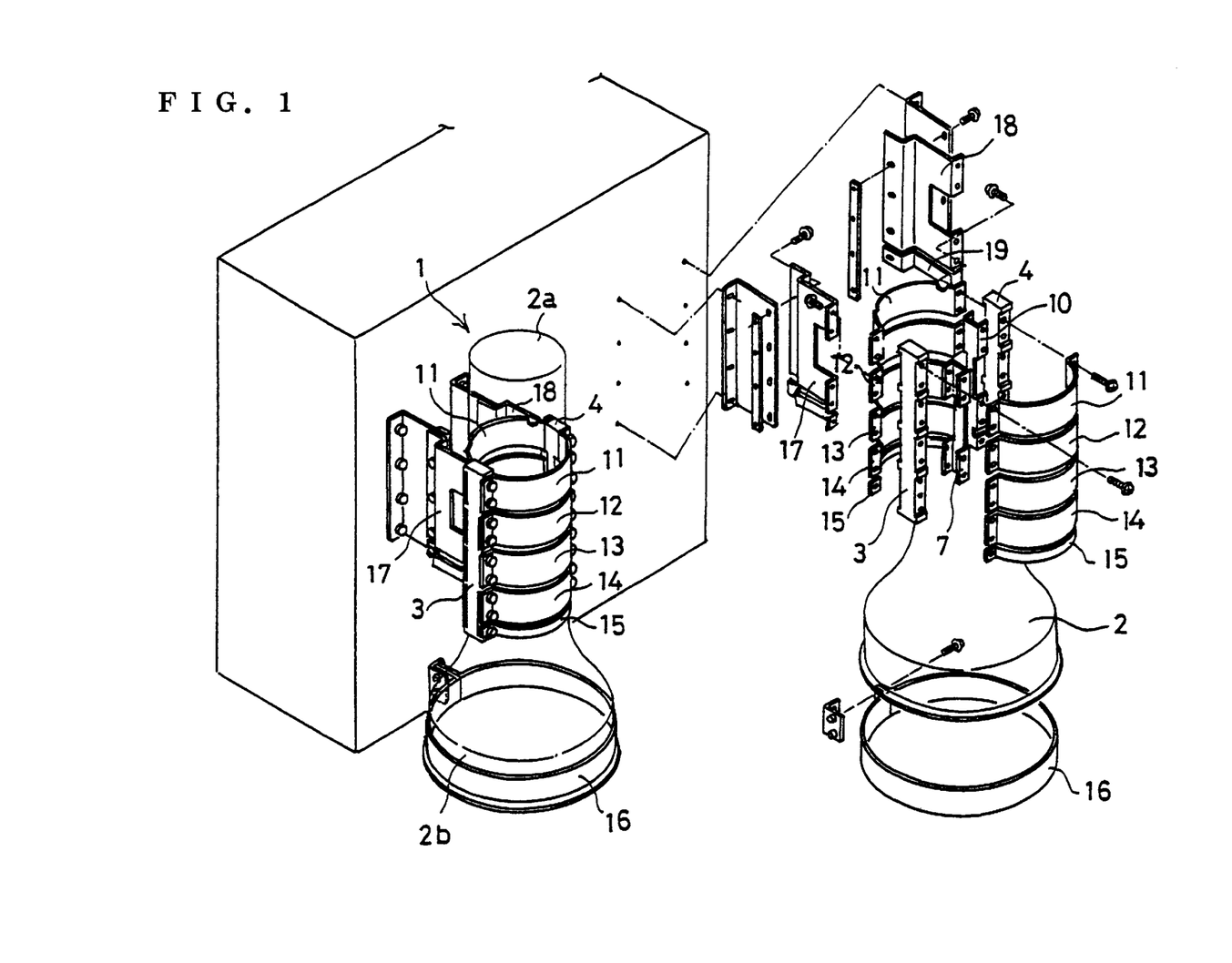
FIG. 1 is a perspective view, partly shown exploded, of a plasma processing apparatus according to a first embodiment of the present invention.

As shown in FIG. 1, a plasma processing apparatus 1 according to a first embodiment of the present invention has a pair of chambers 2 of synthetic quartz or the like each having a substantially tubular (bell jar) shape with a closed upper end thereof connected to a reaction gas inlet tube (not shown). Each of the chambers 2 has a smaller-diameter upper portion 2a defining a space for generating a plasma therein and a larger-diameter lower portion 2b defining a processing space therein.

A pair of vertical columnar insulators 3, 4 is disposed in diametrically opposite relationship on the smaller-diameter upper portion 2a of each of the chambers 2. Each of the vertical columnar insulators 3, 4 is made of alumina, synthetic resin, or the like.

Figure 2:
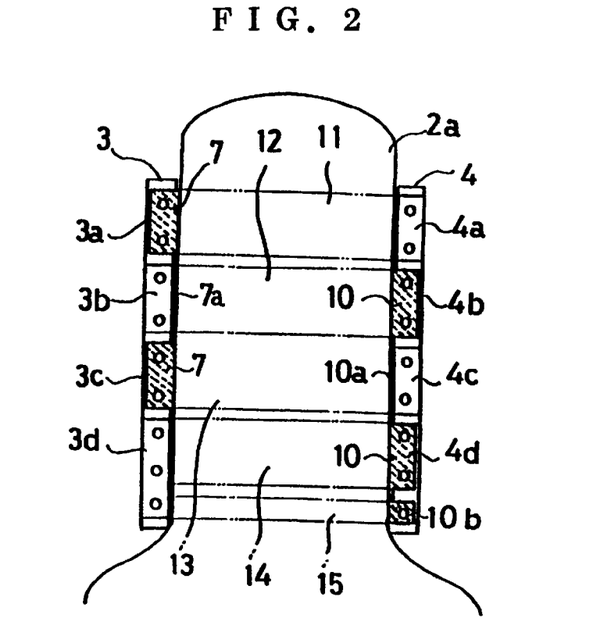
FIG. 2 is a front elevational view of an electrode installed on a chamber of the plasma processing apparatus according to the first embodiment.
Figure 3:
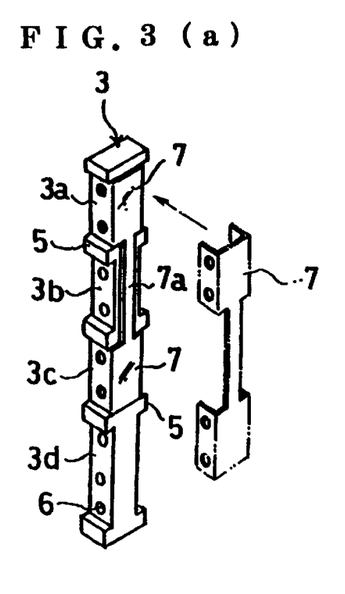
FIGS. 3(a) and 3(b) are perspective views of insulators to which electrodes are fastened.

As shown in FIGS. 2 and 3(a), the columnar insulator 3 has four vertically spaced, first through fourth attachment blocks 3a, 3b, 3c, 3d separated by ribs 5 and each having internally threaded attachment holes 6 defined therein. A vertically elongate channel-shaped conductor 7 of aluminum, copper, or the like is fitted over the first and third attachment blocks 3a, 3c. The conductor 7 has an intermediate narrower portion 7a extending on and along a rear surface of the second attachment block 3b and electrically insulated from side surfaces thereof.

As shown in FIGS. 2 and 3(b), the columnar insulator 4 has four vertically spaced, first through fourth attachment blocks 4a, 4b, 4c, 4d separated by ribs 8 and each having attachment holes 9 defined therein. A vertically elongate channel-shaped conductor 10 of aluminum, copper, or the like is fitted over the second and fourth attachment blocks 4b, 4d. The conductor 10 has an intermediate narrower portion 10a extending on and along a rear surface of the third attachment block 4c and electrically insulated from side surfaces thereof. The conductor 10 also includes an extension 10b on a lower end thereof.

As shown in FIGS. 1 and 2, two web-shaped semicylindrical electrode segments 11 are disposed around respective substantially semicylindrical outer surfaces of, i.e., substantially halfway around, each of the chambers 2 and fastened to side surfaces of the first attachment blocks 3a, 4a of the columnar insulators 3, 4.

Similarly, two web-shaped semicylindrical electrode segments 12 which are disposed respectively around the substantially semicylindrical outer surfaces of each of, i.e., substantially halfway around, the chambers 2 are fastened to side surfaces of the second attachment blocks 3b, 4b of the columnar insulators 3, 4. Two web-shaped semicylindrical electrode segments 13 which are disposed respectively around the substantially semicylindrical outer surfaces of each of, i.e., substantially halfway around, the chambers 2 are fastened to side surfaces of the third attachment blocks 3c, 4c of the columnar insulators 3, 4. Two web-shaped semicylindrical electrode segments 14 which are disposed respectively around the substantially semicylindrical outer surfaces of each of, i.e., substantially halfway around, the chambers 2 are fastened to side surfaces of the fourth attachment blocks 3d, 4d of the columnar insulators 3, 4. Two third web-shaped semicylindrical electrodes 15 which are disposed respectively around the substantially semicylindrical outer surfaces of each of, i.e., substantially halfway around, the chambers 2 are fastened to side surfaces of the fourth attachment blocks 3d, 4d of the columnar insulators 3, 4.

A web-shaped semicylindrical electrode 16 is disposed substantially fully around the lower portion 2b of each of the chambers 2 and is connected to ground.

Specifically, each of the web-shaped semicylindrical electrode segments 11 has an end fixed to the first attachment block 3a through the conductor 7, and each of the web-shaped semicylindrical electrode segments 12 has an end fixed to the second attachment block 4b through the conductor 10. Each of the web-shaped semicylindrical electrode segments 13 has an end fixed to the third attachment block 3c through the conductor 7, and each of the web-shaped electrodes 14 has an end fixed to the fourth attachment block 4d through the conductor 10.

Since the portion of the conductor 7 which is held against the first attachment block 3a is electrically connected to the portion of the conductor 7 which is held against the third attachment block 3c through the intermediate narrower portion 7a, the web-shaped semicylindrical electrode segments 11, 13 can be maintained at the same potential. A cable connected to a high-frequency power supply is connected to the conductor 7 by a screw which is threaded in one of the internally threaded attachment holes 6 in the first attachment block 3a. Since the portion of the conductor 10 which is held against the second attachment block 4b is electrically connected to the portion of the conductor 10 which is held against the fourth attachment block 4d through the intermediate narrower portion 10a, the web-shaped semicylindrical electrode segments 12, 14 can be maintained at the same potential. The web-shaped semicylindrical electrode segments 12, 14 are connected to ground through bifurcated electrode plates 17, 18 (see FIG. 1). The web-shaped semicylindrical electrode 15 is grounded through the extension 10b of the conductor 10 and electrode plates 19.

The web-shaped semicylindrical electrode segments 11, 13 are thus electrically connected to the high-frequency power supply, and jointly serve as a first electrode. The web-shaped semicylindrical electrode segments 12, 14 which are grounded jointly serve as a second electrode for generating a plasma between itself and the first electrode.

The web-shaped semicylindrical electrode segments 12, 14 may instead not be grounded, but may be connected to a power supply which supplies electric energy of a lower frequency than the electric energy generated by the high-frequency power supply to which the web-shaped semicylindrical electrode segments 11, 13 are connected.

Figure 4:
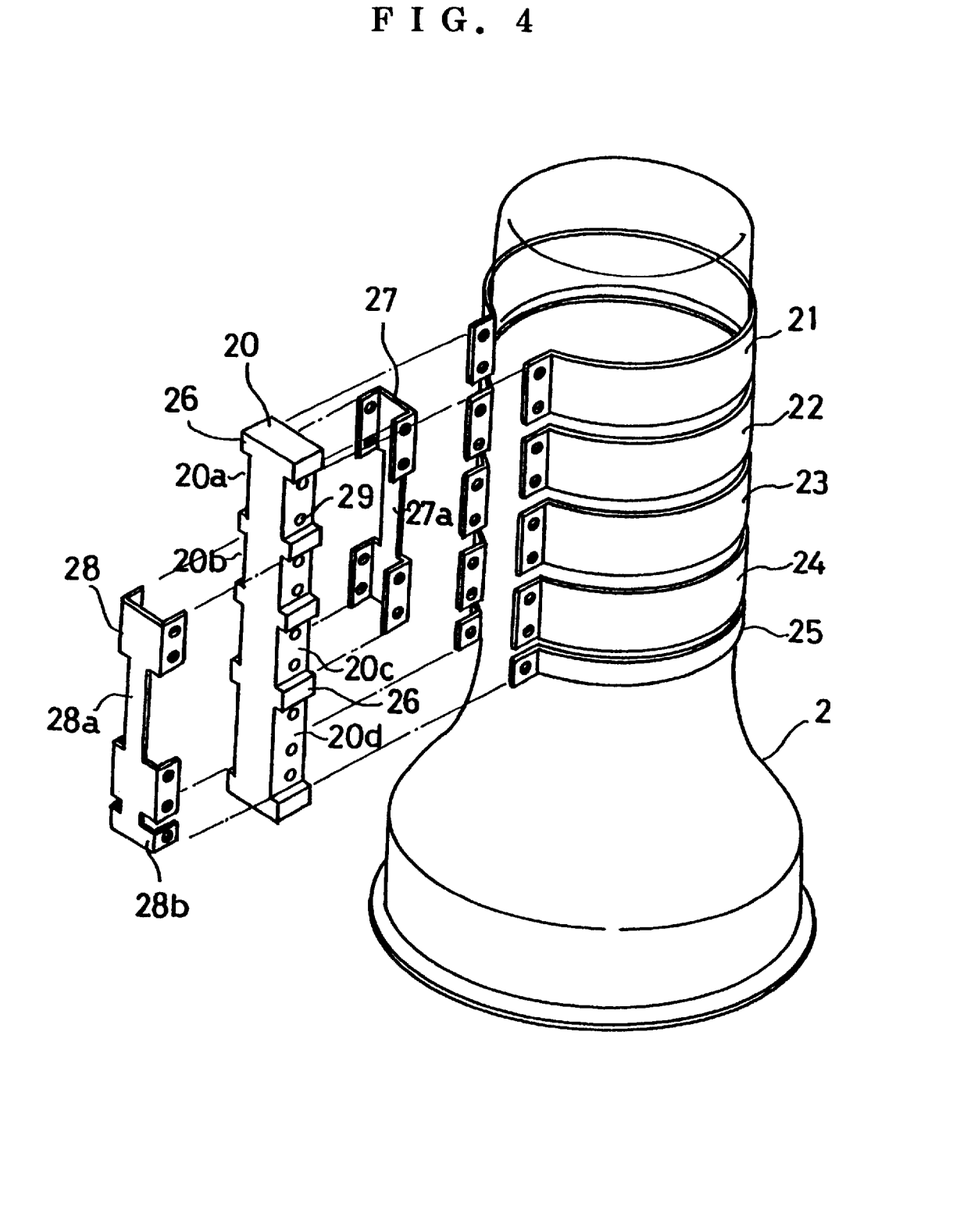
FIG. 4 is an exploded perspective view of a plasma processing apparatus according to a second embodiment of the present invention.
Figure 5:
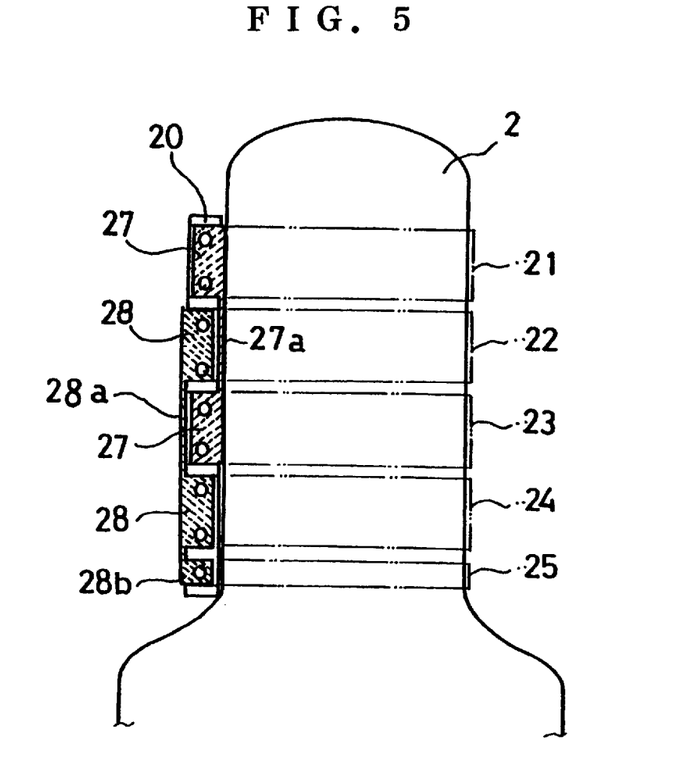
FIG. 5 is a front elevational view of an electrode installed on a chamber of the plasma processing apparatus according to the second embodiment.

FIGS. 4 and 5 show a plasma processing apparatus according to a second embodiment of the present invention. In the first embodiment described above, the ends of the web-shaped electrodes are fastened to the two columnar insulators. According to the second embodiment, however, ends of web-shaped cylindrical electrode segments are fastened to a single columnar insulator.

The columnar insulator 20 has four vertically spaced, first through fourth attachment blocks 20a, 20b, 20c, 20d separated by ribs 26 and each having internally threaded attachment holes 29 defined therein. A vertically elongate channel-shaped common conductor 27 is fitted over the first and third attachment blocks 20a, 20c. A vertically elongate channel-shaped common conductor 28 is fitted over the second and fourth attachment blocks 20b, 20d in opposite relationship to the common conductor 27 and electrically insulated from the common conductor 27. The conductor 27 has an intermediate narrower portion 27a, and the conductor 28 has an intermediate narrower portion 28a and an extension 28b on its lower end.

A web-shaped cylindrical electrode segment 21 is disposed substantially fully around a chamber 2 and has ends fastened through the conductor 27 to side surfaces of the first attachment block 20a of the columnar insulator 20. A web-shaped cylindrical electrode segment 22 which is disposed substantially fully around the chamber 2 has ends fastened through the conductor 28 to side surfaces of the second attachment block 20b of the columnar insulator 20. A web-shaped cylindrical electrode segment 23 which is disposed substantially fully around the chamber 2 has ends fastened through the conductor 27 to side surfaces of the third attachment block 20c of the columnar insulator 20. A web-shaped cylindrical electrode segment 24 which is disposed substantially fully around the chamber 2 has ends fastened through the conductor 28 to side surfaces of the fourth attachment block 20d of the columnar insulator 20. A third web-shaped electrode 25 which is disposed substantially fully around the chamber 1 has ends fastened through the conductor 28 to side surfaces of the fourth attachment block 20d of the columnar insulator 20.

The web-shaped cylindrical electrode segments 21, 23 can be maintained at the same potential and jointly serve as a first electrode connected to a high-frequency power supply. The web-shaped cylindrical electrode segments 22, 24 can be maintained at the same potential and jointly serve as a second electrode for generating a plasma between itself and the first electrode.

In the first and second embodiments, the first and second electrodes are provided by the four web-shaped cylindrical electrode segments. However, the number of web-shaped cylindrical electrode segments is arbitrary. The chambers are not limited to the illustrated configuration, but may have upper and lower portions of substantially the same diameter or may have upper and lower portions which are separate from each other and can individually be replaced.

A plasma processing apparatus according to a third embodiment of the present invention will be described below with reference to FIGS. 6 and 7.

Figure 6:
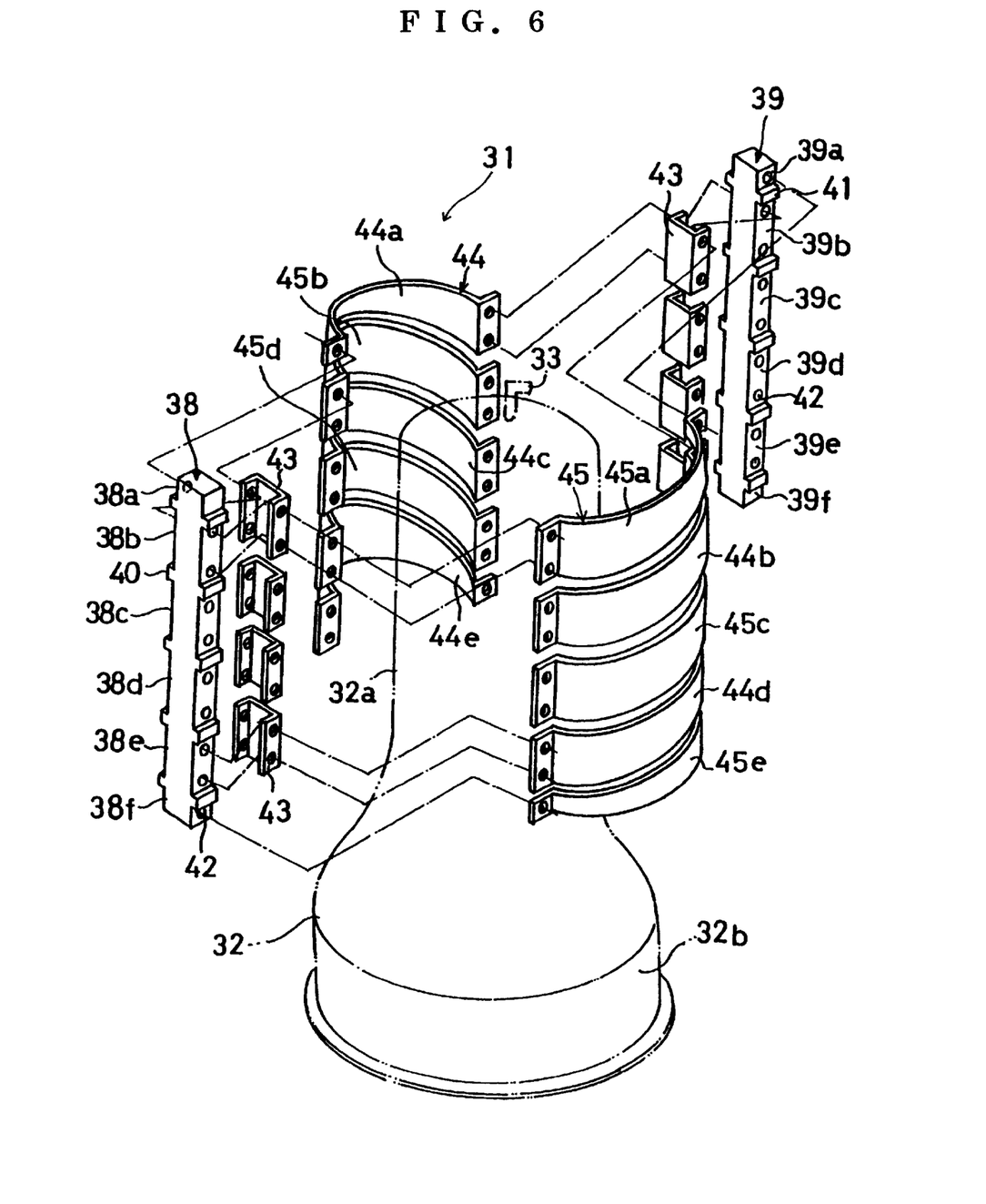
FIG. 6 is an exploded perspective view of a plasma processing apparatus according to a third embodiment of the present invention.
Figure 7:
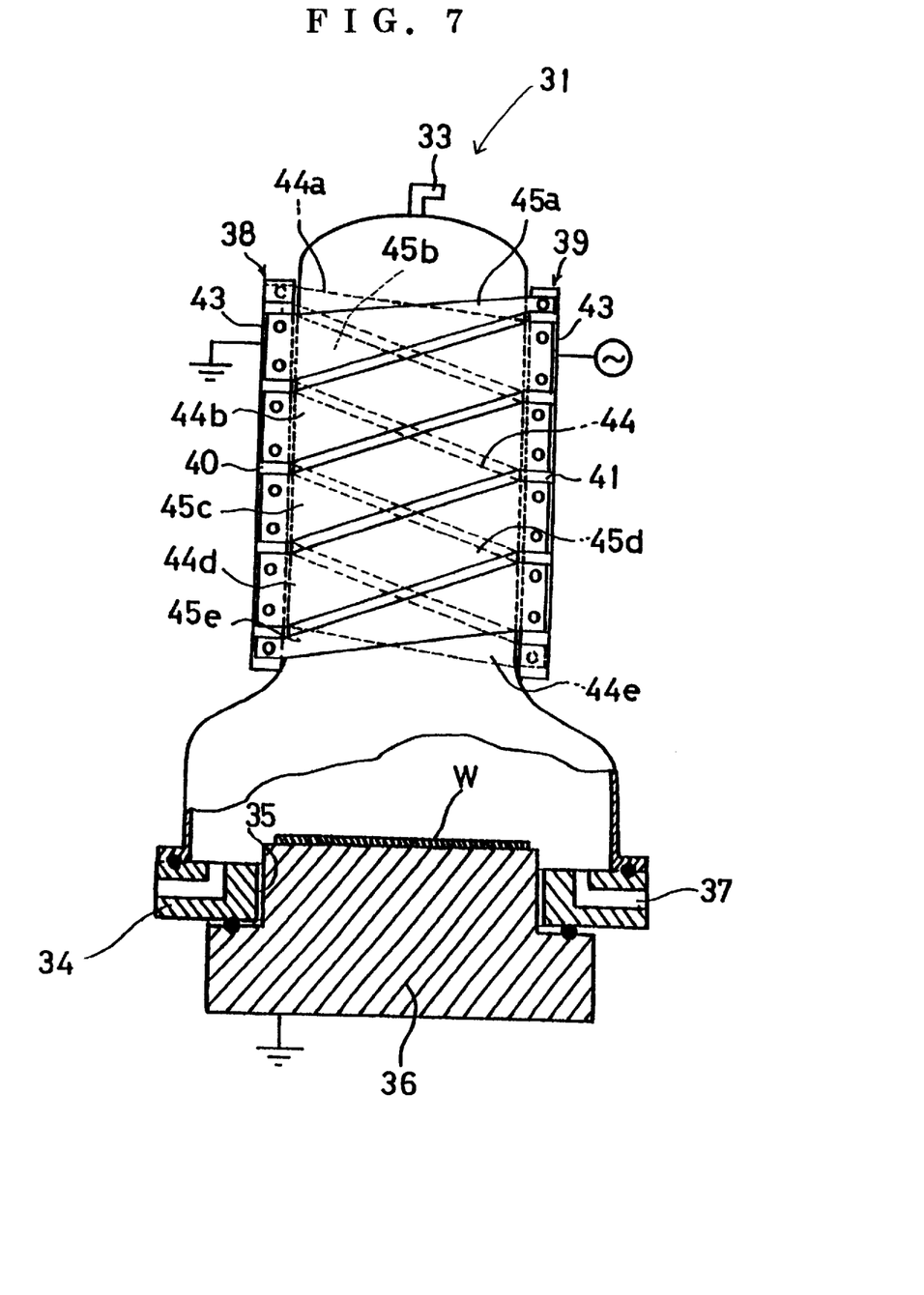
FIG. 7 is a front elevational view of an electrode installed on a chamber of the plasma processing apparatus according to the third embodiment.

As shown in FIGS. 6 and 7, the plasma processing apparatus, generally designated by the reference numeral 31, has a chamber 32 of synthetic quartz or the like having a substantially tubular or bell jar shape with a closed upper end thereof connected to a reaction gas inlet tube 33.

The chamber 32 has a smaller-diameter upper portion 32a defining a space for generating a plasma therein and a larger-diameter lower portion 32b defining a processing space therein. The larger-diameter lower portion 32b is hermetically fixed to a base 34 and has an open lower end disposed in covering relationship to an opening 35 defined in the base 34. A table 36 for placing a semiconductor wafer W to be processed is vertically movably disposed in the opening 35. The base 34 has a passage 37 defined therein which is connected to an evacuating device (not shown) for evacuating the chamber 32.

A pair of vertical columnar insulators 38, 39 made of alumina, synthetic resin, or the like is disposed in diametrically opposite relationship on the smaller-diameter upper portion 32a of the chamber 32. The columnar insulator 38 has six vertically spaced attachment blocks 38a, 38b, 38c, 38d, 38e, 38f separated by ribs 40. The columnar insulator 39 has six vertically spaced attachment blocks 39a, 39b, 39c, 39d, 39e, 39f separated by ribs 41. Each of the attachment blocks 38a, 39a, 38f, 39f at the upper and lower ends of the columnar insulators 38, 39 has an internally threaded attachment hole 42 defined in one of front and rear surfaces thereof. Each of the other attachment blocks 38b, 38c, 38d, 38e, 39b, 39c, 39d, 39e has two internally threaded attachment holes 42 defined in each of front and rear surfaces thereof. Channel-shaped conductors 43 of aluminum, copper, or the like are fitted respectively over these attachment blocks 38b, 38c, 38d, 38e, 39b, 39c, 39d, 39e.

A plurality of web-shaped semicylindrical electrode segments have ends fastened to the attachment blocks. Specifically, a tapered web-shaped semicylindrical electrode segment 44a has a narrower end fixed to a rear surface of the attachment block 38a by a screw threaded into the attachment hole 42 and a wider end fixed through the conductor 43 to a rear surface of the attachment block 39b by screws threaded into the attachment holes 42. A web-shaped semicylindrical electrode segment 44b has an end fixed through the conductor 43 to a front surface of the attachment block 39b by screws threaded into the attachment holes 42 and an opposite end fixed through the conductor 43 to a front surface of the attachment block 38c by screws threaded into the attachment holes 42. A web-shaped semicylindrical electrode segment 44c has an end fixed through the conductor 43 to a rear surface of the attachment block 38c by screws threaded into the attachment holes 42 and an opposite end fixed through the conductor 43 to a rear surface of the attachment block 39d by screws threaded into the attachment holes 42. A web-shaped semicylindrical electrode segment 44d has an end fixed through the conductor 43 to a front surface of the attachment block 39d by screws threaded into the attachment holes 42 and an opposite end fixed through the conductor 43 to a front surface of the attachment block 38e by screws threaded into the attachment holes 42. A tapered web-shaped semicylindrical electrode segment 44e has a wider end fixed through the conductor 43 to a rear surface of the attachment block 38e by screws threaded into the attachment holes 42 and a narrower end fixed to a rear surface of the attachment block 39f by a screw threaded into the attachment hole 42. These web-shaped semicylindrical electrode segments 44a, 44b, 44c, 44d, 44e are thus electrically connected to each other by the conductors 43, and jointly serve as a first electrode 44.

A tapered web-shaped semicylindrical electrode segment 45a has a narrower end fixed to a front surface of the attachment block 39a by a screw threaded into the attachment hole 42 and a wider end fixed through the conductor 43 to a front surface of the attachment block 38b by screws threaded into the attachment holes 42. A web-shaped semicylindrical electrode segment 45b has an end fixed through the conductor 43 to a rear surface of the attachment block 38b by screws threaded into the attachment holes 42 and an opposite end fixed through the conductor 43 to a rear surface of the attachment block 39c by screws threaded into the attachment holes 42. A web-shaped semicylindrical electrode segment 45c has an end fixed through the conductor 43 to a front surface of the attachment block 39c by screws threaded into the attachment holes 42 and an opposite end fixed through the conductor 43 to a front surface of the attachment block 38d by screws threaded into the attachment holes 42. A web-shaped semicylindrical electrode segment 45d has an end fixed through the conductor 43 to a rear surface of the attachment block 38d by screws threaded into the attachment holes 42 and an opposite end fixed through the conductor 43 to a rear surface of the attachment block 39e by screws threaded into the attachment holes 42. A tapered web-shaped semicylindrical electrode segment 45e has a wider end fixed through the conductor 43 to a front surface of the attachment block 39e by screws threaded into the attachment holes 42 and a narrower end fixed to a front surface of the attachment block 38f by a screw threaded into the attachment hole 42. These web-shaped semicylindrical electrode segments 45a, 45b, 45c, 45d, 45e are thus electrically connected to each other by the conductors 43, and jointly serve as a second electrode 45.

The first electrode 44 which is jointly made up of the electrically connected web-shaped semicylindrical electrode segments 44a~44e, and the second electrode 45 which is jointly made up of the electrically connected web-shaped semicylindrical electrode segments 45a~45e are helically wound around the chamber 32 and spaced at a constant distance from each other. The first electrode 44 is connected to a high-frequency power supply, whereas the second electrode 45 is connected to ground. When the high-frequency power supply is turned on, a plasma is generated in the gap between the first and second electrodes 44, 45.

While the web-shaped semicylindrical electrode segments 44a, 45a, 44e, 45e are tapered in shape in the third embodiment, all of the web-shaped semicylindrical electrode segments may be identical in shape to each other.

Figure 8:
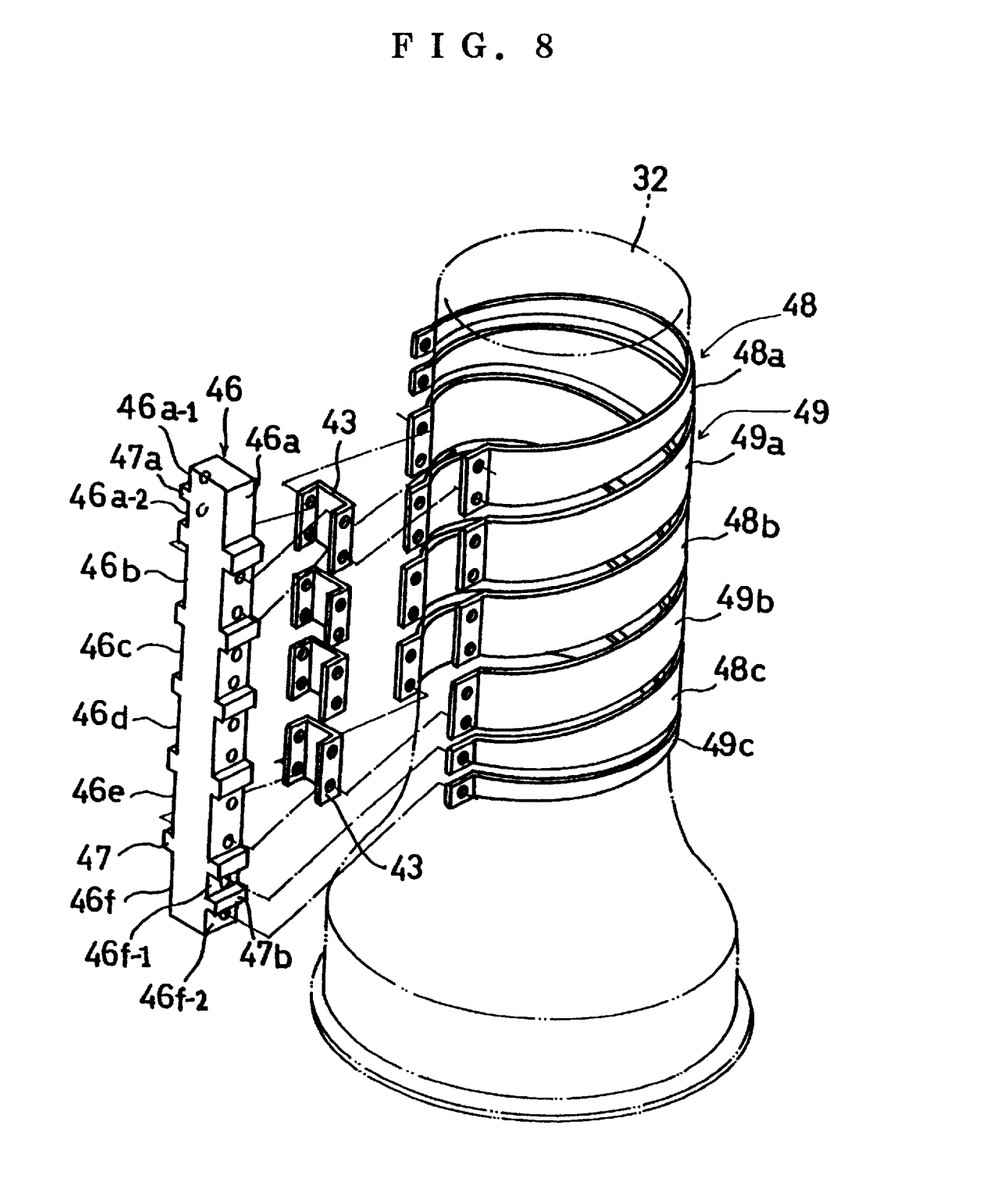
FIG. 8 is an exploded perspective view of a plasma processing apparatus according to a fourth embodiment of the present invention.
Figure 9:
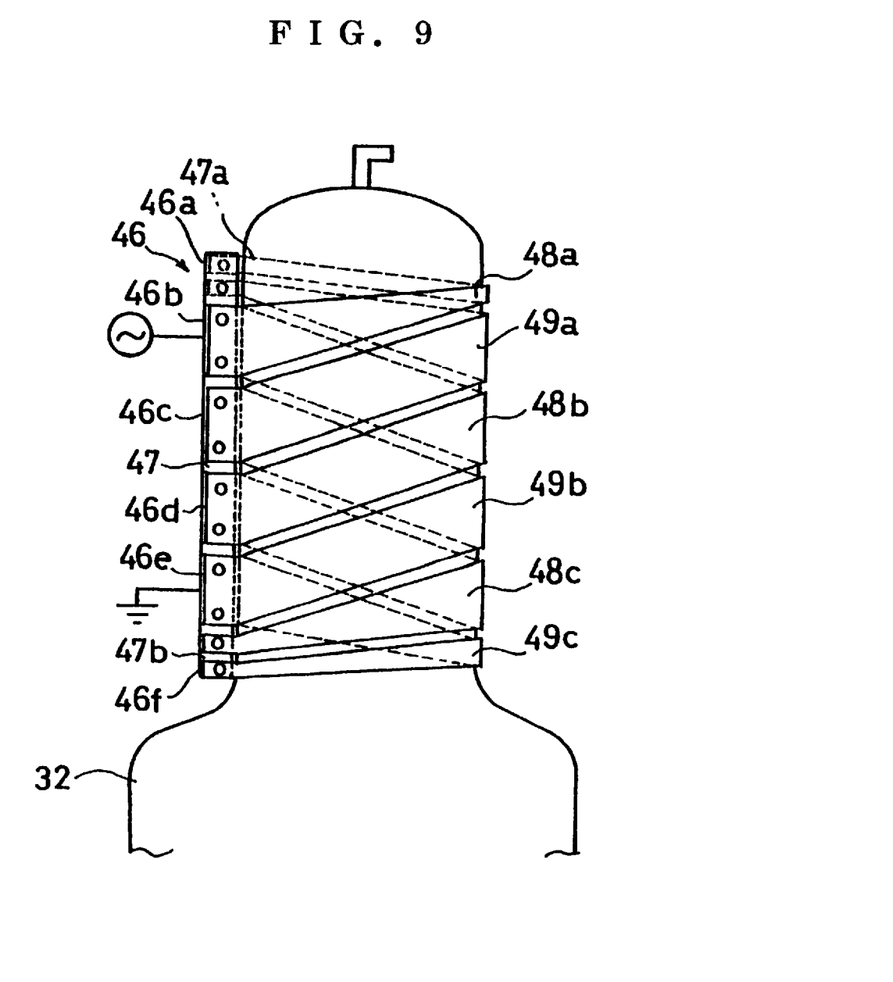
FIG. 9 is a front elevational view of an electrode installed on a chamber of the plasma processing apparatus according to the fourth embodiment.

A plasma processing apparatus according to a fourth embodiment of the present invention will be described below with reference to FIGS. 8 and 9.

The plasma processing apparatus according to the fourth embodiment has a single columnar insulator 46 to which ends of web-shaped cylindrical electrode segments are attached.

The single columnar insulator 46 has six vertically spaced attachment blocks 46a, 46b, 46c, 46d, 46e, 46f separated by ribs 47. The attachment block 46a is divided into attachment blocks 46a-1, 46a-2 by a rib 47a on a rear surface thereof, and the attachment block 46f is divided into attachment blocks 46f-1, 46f-2 by a rib 47b on a front surface thereof. Channel-shaped conductors 43 of aluminum, copper, or the like are fitted respectively over the attachment blocks 46b, 46c, 46d, 46e.

A tapered web-shaped cylindrical electrode segment 48a has a narrower end fastened to a rear surface of the attachment block 46a-1 and a wider end fastened through the conductor 43 to a front surface of the attachment block 46b. A web-shaped cylindrical electrode segment 48b has an end fastened through the conductor 43 to a rear surface of the attachment block 46b and an opposite end fastened through the conductor 43 to a front surface of the attachment block 46d. A tapered web-shaped cylindrical electrode segment 48c has a wider end fastened through the conductor 43 to a rear surface of the attachment block 46d and a narrower end fastened through the conductor 43 to a front surface of the attachment block 46f-1. The web-shaped cylindrical electrode segments 48a, 48b, 48c are electrically connected by the conductors 43 and jointly serve as a first electrode 48 connected to a high-frequency power supply.

A tapered web-shaped cylindrical electrode segment 49a has a narrower end fastened to a rear surface of the attachment block 46a-2 and a wider end fastened through the conductor 43 to a front surface of the attachment block 46c. A web-shaped cylindrical electrode segment 49b has an end fastened through the conductor 43 to a rear surface of the attachment block 46c and an opposite end fastened through the conductor 43 to a front surface of the attachment block 46e. A tapered web-shaped cylindrical electrode segment 49c has a wider end fastened through the conductor 43 to a rear surface of the attachment block 46e and a narrower end fastened to a front surface of the attachment block 46f-2. The web-shaped cylindrical electrode segments 49a, 49b, 49c are electrically connected by the conductors 43 and jointly serve as a second electrode 49 connected to ground.

The first electrode 48 which is jointly made up of the electrically connected web-shaped cylindrical electrode segments 48a~48c, and the second electrode 49 which is jointly made up of the electrically connected web-shaped cylindrical electrode segments 49a~49c are helically wound around a chamber 32 and spaced at a constant distance from each other.

In each of the third and fourth embodiments, the first electrode is connected to the high-frequency power supply, and the second electrode is grounded. However, the first electrode may be connected to the high-frequency power supply, and the second electrode may be connected to a power supply which supplies electric energy of a lower frequency than the electric energy generated by the high-frequency power supply to which the first electrode is connected. Alternatively, ends (upper ends) of the first and second electrodes may be connected to a high-frequency power supply, whereas the other ends (lower ends) of the first and second electrodes may be connected to ground or a power supply which supplies electric energy of a lower frequency than the electric energy generated by the high-frequency power supply to which the ends of the first and second electrodes are connected.

Figure 10:
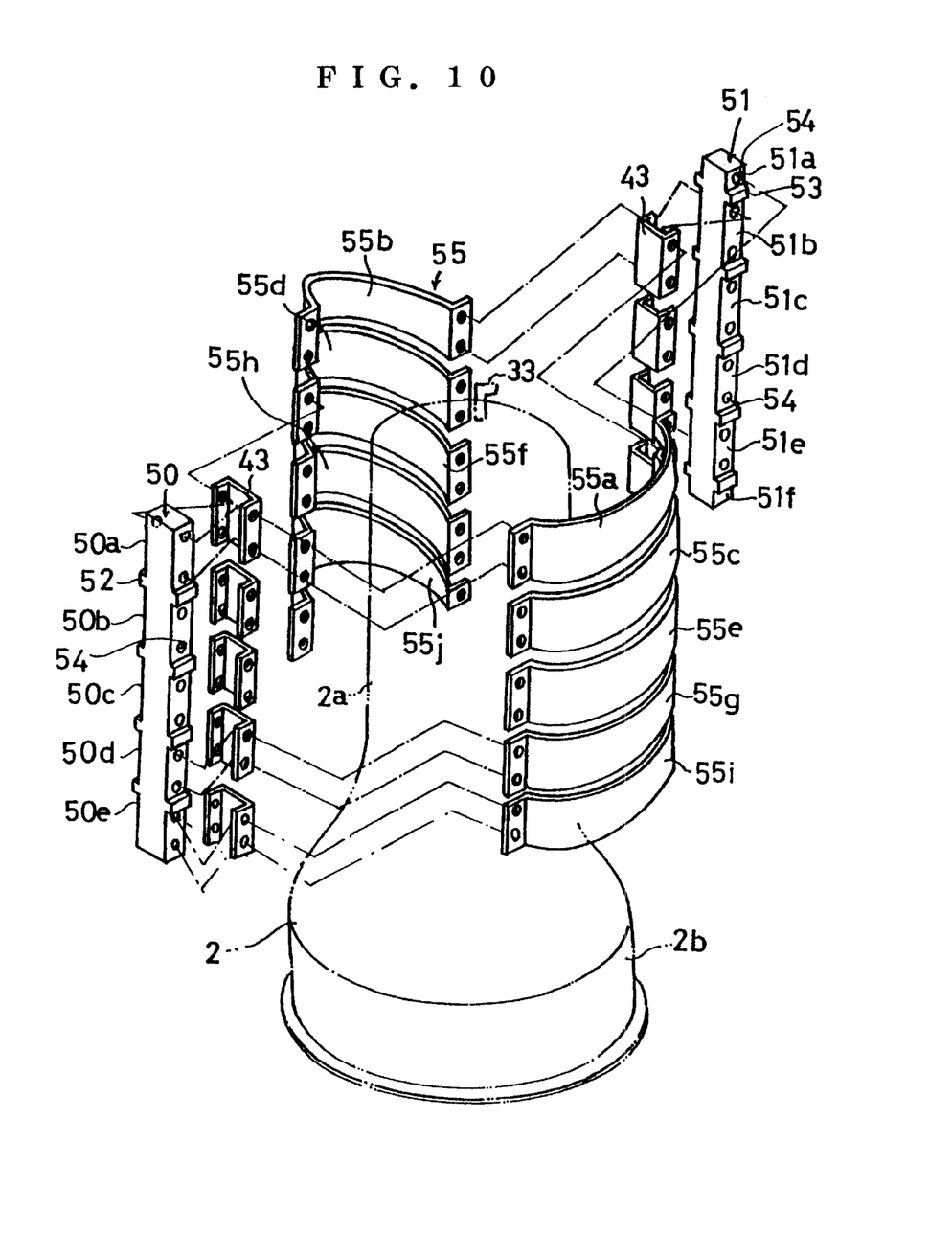
FIG. 10 is an exploded perspective view of a plasma processing apparatus according to a fifth embodiment of the present invention.
Figure 11:
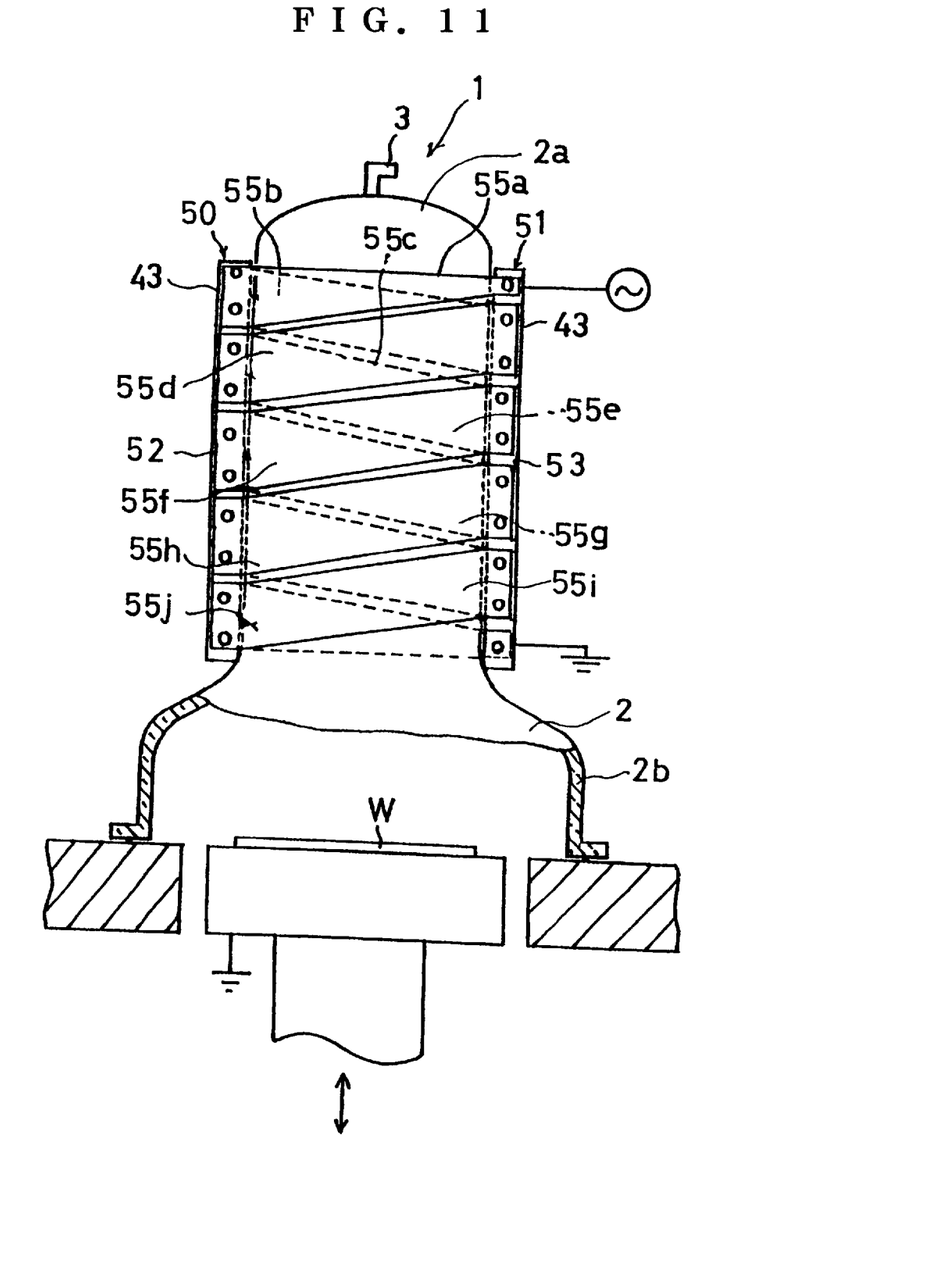
FIG. 11 is a front elevational view of an electrode installed on a chamber of the plasma processing apparatus according to the fifth embodiment.

FIGS. 10 and 11 illustrate a plasma processing apparatus according to a fifth embodiment of the present invention.

According to the fifth embodiment, ends of web-shaped semicylindrical electrode segments are fastened to two columnar insulators as with the third embodiment.

Specifically, a columnar insulator 50 has five vertically spaced attachment blocks 50a, 50b, 50c, 50d, 50e, separated by ribs 52, and a columnar insulator 51 has six vertically spaced attachment blocks 51a, 51b, 51c, 51d, 51e, 51f separated by ribs 53. Each of the attachment blocks 51a, 51f at the upper and lower ends of the columnar insulator 51 has an internally threaded attachment hole 54 defined in one of front and rear surfaces thereof. Each of the other attachment blocks 50a, 50b, 50c, 50d, 50e, 51b, 51c, 51d, 51e has two internally threaded attachment holes 54 defined in each of front and rear surfaces thereof. Channel-shaped conductors 43 of aluminum, copper, or the like are fitted respectively over these attachment blocks 50a, 50b, 50c, 50d, 50e, 51b, 51c, 51d, 51e.

A tapered web-shaped semicylindrical electrode segment 55a has a narrower end fixed to a front surface of the attachment block 51a by a screw threaded into the attachment hole 54 and a wider end fixed through the conductor 43 to a front surface of the attachment block 50a by screws threaded into the attachment holes 54. A web-shaped semicylindrical electrode segment 55b has an end fixed through the conductor 54 to a rear surface of the attachment block 50a by screws threaded into the attachment holes 54 and an opposite end fixed through the conductor 43 to a rear surface of the attachment block 51b by screws threaded into the attachment holes 54. A web-shaped semicylindrical electrode segment 55c has an end fixed through the conductor 43 to a front surface of the attachment block 51b by screws threaded into the attachment holes 54 and an opposite end fixed through the conductor 43 to a front surface of the attachment block 50b by screws threaded into the attachment holes 54. A web-shaped semicylindrical electrode segment 55d has an end fixed through the conductor 43 to a rear surface of the attachment block 50b by screws threaded into the attachment holes 54 and an opposite end fixed through the conductor 43 to a rear surface of the attachment block 51c by screws threaded into the attachment holes 54. A web-shaped semicylindrical electrode segment 55e has an end fixed through the conductor 43 to a front surface of the attachment block 51c by screws threaded into the attachment holes 54 and an opposite end fixed through the conductor 43 to a front surface of the attachment block 50c by screws threaded into the attachment holes 54. A web-shaped semicylindrical electrode segment 55f has an end fixed through the conductor 43 to a rear surface of the attachment block 50c by screws threaded into the attachment holes 54 and an opposite end fixed through the conductor 43 to a rear surface of the attachment block 51d by screws threaded into the attachment holes 54. A web-shaped semicylindrical electrode segment 55g has an end fixed through the conductor 43 to a front surface of the attachment block 51d by screws threaded into the attachment holes 54 and an opposite end fixed through the conductor 43 to a front surface of the attachment block 50d by screws threaded into the attachment holes 54. A web-shaped semicylindrical electrode segment 55h has an end fixed through the conductor 43 to a rear surface of the attachment block 50d by screws threaded into the attachment holes 54 and an opposite end fixed through the conductor 43 to a rear surface of the attachment block 51e by screws threaded into the attachment holes 54. A web-shaped semicylindrical electrode segment 55i has an end fixed through the conductor 43 to a front surface of the attachment block 51e by screws threaded into the attachment holes 54 and an opposite end fixed through the conductor 43 to a front surface of the attachment block 50e by screws threaded into the attachment holes 54. A tapered web-shaped semicylindrical electrode segment 55j has a wider end fixed through the conductor 43 to a rear surface of the attachment block 50e by screws threaded into the attachment holes 54 and a narrower end fixed to a rear surface of the attachment block 51f by a screw threaded into the attachment hole 54. These web-shaped semicylindrical electrode segments 55a, 55b, 55c, 55d, 55e, 55f, 55g, 55h, 55i, 55j are thus electrically connected to each other by the conductors 13, and jointly serve as an electrode 55.

In the fifth embodiment, an end (upper end) of the electrode 55 may be connected to a high-frequency power supply, whereas the other end (lower end) of the electrode 55 may be connected to ground or a power supply which supplies electric energy of a lower frequency than the electric energy generated by the high-frequency power supply to which the end of the electrode 55 is connected.

With the present invention, as described above, the gap between the first and second electrodes can be maintained constant for a long period of time for generating a uniform plasma therein.

In the first, third, and fifth embodiments, the web-shaped electrode segments are fastened to the two insulators, and hence can firmly be secured in position. In the second and fourth embodiments, the web-shaped electrode segments are fastened to the single insulator, and hence are of a simple structure and can be fixed easily in position.

The uppermost web-shaped electrode segment serves as a first electrode connected to a high-frequency power supply, whereas the lowermost web-shaped electrode serves as a second electrode connected to ground for stably generating a plasma.

In the case where the first and second electrodes for generating a plasma are helically wound in spaced relationship to each other, the first and second electrodes are composed of a plurality of web-shaped electrode segments wound substantially semicylindrically or cylindrically, i.e., substantially halfway or fully, around the chamber. The opposite ends of each of the web-shaped electrode segments are fastened to a pair of insulators or a single insulator, and the web-shaped electrode segments of the first electrode and the web-shaped electrode segments of the second electrode are electrically connected by conductors mounted on the insulators or insulator. This arrangement makes it possible to keep constant the gap between the first and second electrodes for a long period of time for generating a uniform plasma therein.

The web-shaped electrode segments for generating a plasma are electrically connected around the chamber to maintain constant the gap between the electrodes for a long period of time.

The web-shaped electrode segments fastened to the two insulators permit the electrodes to be fixed securely in position. The web-shaped electrode segments fastened to the single insulator, as with the second embodiment, allows the electrodes to be simple in structure and fastened easily in position.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. A plasma processing apparatus comprising:
    a chamber having a substantially tubular shape with a closed upper end thereof;
    a first electrode disposed on said chamber and connected to a high-frequency power supply;
    a second electrode disposed on said chamber for generating a plasma between said second electrode and said first electrode, said second electrode being connected to ground or a power supply which supplies electric energy of a lower frequency than electric energy supplied by said high frequency power supply;
    insulator means disposed outside of said chamber for having said electrodes secured thereto; and
    conductor means mounted on said insulator means;
    each of said first electrode and said second electrode comprising a plurality of web-shaped electrode segments, said web-shaped electrode segments of said first electrode and said web-shaped electrode segments of said second electrode being vertically alternately arranged in spaced relationship, each of said web-shaped electrode segments having opposite ends fastened to said insulator means, said web-shaped electrode segments of said first electrode being electrically connected to each other by said conductor means, and said web-shaped electrode segments of said second electrode being electrically connected to each other by said conductor means.

2. A plasma processing apparatus according to claim 1, wherein an uppermost one of said web-shaped electrode segments serves as said first electrode.

3. A plasma processing apparatus according to claim 1, further comprising a lowermost third electrode disposed on said chamber below said first and second electrodes and connected to ground.

4. A plasma processing apparatus according to claim 1, further comprising:
    a base having an opening defined therein, said chamber having an open lower end mounted on said base in covering relationship to said opening; and
    a table for supporting a workpiece to be processed, said table being vertically movably disposed in said opening.

5. A plasma processing apparatus according to 1, further comprising:
    a reaction gas inlet tube connected to an upper portion of said chamber.

6. A plasma processing apparatus according to claim 1, wherein said insulator means comprises a pair of insulators, said conductor means comprises a pair of conductors, each of said web-shaped electrode segments is disposed substantially halfway around said chamber and said opposite ends thereof are fastened to said insulators, respectively, said web-shaped electrode segments of said first electrode being connected to each other by one of said conductors, and said web-shaped electrode segments of said second electrode being connected to each other by the other of said conductors.

7. A plasma processing apparatus according to claim 1, wherein said insulator means comprises a single insulator, said conductor means comprises a pair of conductors mounted on said single insulator, each of said web-shaped electrode segments being disposed substantially fully around said chamber and having opposite ends fastened to said single insulator, said web-shaped electrode segments of the first electrode being electrically connected to each other by one of said conductors, and said web-shaped electrode segments of said second electrode being electrically connected to each other by the other of said conductors.

8. A plasma processing apparatus according to claim 7, further comprising a lowermost third electrode disposed on said chamber below said first and second electrodes and connected to ground.

9. A plasma processing apparatus comprising:

a chamber having a substantially tubular shape with a closed upper end thereof;

a pair of first and second electrodes helically wound around said chamber and spaced from each other by a constant gap;

insulator means disposed outside of said chamber; and conductor means mounted on said insulator means;

each of said first electrode and said second electrode comprising a plurality of web-shaped electrode segments each having opposite ends fastened to said insulator means, said web-shaped electrode segments of said first electrode being electrically connected to each other by said conductor means, and said web-shaped electrode segments of said second electrode being electrically connected to each other by said conductor means.

10. A plasma processing apparatus according to claim 9, wherein said first electrode is connected to a high-frequency power supply, and said second electrode is connected to a power supply which supplies electric energy of a lower frequency than electric energy supplied by said high-frequency power supply.

11. A plasma processing apparatus according to claim 9, wherein said first electrode is connected to a high-frequency power supply, and said second electrode is connected to ground.

12. A plasma processing apparatus according to claim 9, wherein each of said first electrode and said second electrode has an end connected to a high-frequency power supply, and an opposite end connected to ground or a power supply which supplies electric energy of a lower frequency than electric energy supplied by said high-frequency power supply.

13. A plasma processing apparatus according to claim 9, wherein said insulator means comprises a pair of insulators, said conductor means comprises a plurality of conductors, each of said web-shaped electrode segments is disposed substantially halfway around said chamber and has opposite ends fastened to said insulators, said web-shaped electrode segments of said first electrode being electrically connected to each other by a first group of said conductors, and said web-shaped electrode segments of said second electrode being electrically connected to each other by a second group of said conductors.

14. A plasma processing apparatus according to claim 9, wherein said insulator means comprises a single insulator, said conductor means comprises a plurality of conductors, each of said web-shaped electrode segments is disposed substantially fully around said chamber and has opposite ends fastened to said single insulator, said web-shaped electrode segments of said first electrode being electrically connected to each other by a first group of said conductors, and said web-shaped electrode segments of said second electrode being electrically connected to each other by a second group of said conductors.

15. A plasma processing apparatus according to claim 9, further comprising:

a base having an opening defined therein, said chamber having an open lower end mounted on said base in covering relationship to said opening; and a table for supporting a workpiece to be processed, said table being vertically movably disposed in said opening.

16. A plasma processing apparatus according to claim 9, further comprising:

a reaction gas inlet tube connected to an upper portion of said chamber.

17. A plasma processing apparatus comprising:

a chamber having a substantially tubular shape with a closed upper end thereof;

an electrode helically wound around said chamber and comprising a plurality of web-shaped electrode segments spaced by a constant gap and disposed substantially halfway around said chamber;

a pair of insulators disposed outside of said chamber; and a plurality of conductors mounted on said insulators;

each of said web-shaped electrode segments having opposite ends fastened to said insulators, said web-shaped electrode segments being electrically connected through said conductors to form said electrode.

18. A plasma processing apparatus according to claim 17, wherein said electrode has an end connected to a high-frequency power supply, and an opposite end connected to ground or a power supply which supplies electric energy of a lower frequency than electric energy supplied by said high-frequency power supply.

19. A plasma processing apparatus according to claim 18, wherein said end connected to said high-frequency power supply comprises an upper end of said electrode.

20. A plasma processing apparatus according to claim 17, further comprising:

a base having an opening defined therein, said chamber having an open lower end mounted on said base in covering relationship to said opening; and a table for supporting a workpiece to be processed, said table being vertically movably disposed in said opening.

21. A plasma processing apparatus according to claim 17, further comprising:

a reaction gas inlet tube connected to an upper portion of said chamber.

* * * * *

UNITED STATES PATENT AND TRADEMARK OFFICE
CERTIFICATE OF CORRECTION

PATENT NO : 5,846,329
DATED : 08 December 1998
INVENTOR(S): Hisashi Hori, Kazuto Ohbuchi, Atsushi Matsushita, Kaoru Sakamoto It is certified that error appears in the above-identified patent and that said Letters Patent is hereby corrected as shown below:

On the cover page, under "[56] References Cited", correct "Usue et al." to --Usui et al.--; correct "Ishimani" to --Ishimaru--.

Column 6, 52nd line, change "1" to --2--.

Column 12, line 38 (claim 5, line 1), before "1" insert --claim--.

Signed and Sealed this

Twentieth Day of April, 1999

Attest:

Attesting Officer

Q. TODD DICKINSON
Acting Commissioner of Patents and Trademarks